(12) United States Patent
Jain et al.

(10) Patent No.: US 8,966,423 B2
(45) Date of Patent: Feb. 24, 2015

(54) INTEGRATING OPTIMAL PLANAR AND THREE-DIMENSIONAL SEMICONDUCTOR DESIGN LAYOUTS

(71) Applicant: GLOBALFOUNDARIES Inc., Grand Cayman (KY)

(72) Inventors: Navneet Jain, Milpitas, CA (US); Yunfei Deng, Sunnyvale, CA (US); Mahbub Rashed, Cupertino, CA (US); David Doman, Austin, TX (US); Qi Xiang, San Jose, CA (US); Jongwook Kye, Pleasanton, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/792,946

(22) Filed: Mar. 11, 2013

(65) Prior Publication Data
US 2014/0258960 A1    Sep. 11, 2014

(51) Int. Cl.
*G06F 17/50* (2006.01)
(52) U.S. Cl.
CPC .................................. *G06F 17/5072* (2013.01)
USPC .......................................... 716/119; 716/120

(58) Field of Classification Search
CPC ...................... H01L 27/1104; H01L 27/11807; H01L 2924/0002; H01L 29/0673; H01L 21/823814; H01L 29/045; H01L 21/823828; H01L 29/105; H01L 21/82385; H01L 27/105; H01L 22/34; H01L 23/5256; H01L 29/1037; H01L 21/823821; H01L 27/0207; H01L 27/0886; H01L 29/66545; H01L 29/66553; H01L 29/66795; H01L 29/785; H01L 29/7854; H01L 21/4867; H01L 21/6835; H01L 21/845; G06F 17/5068; G06F 17/5081
USPC .................................................... 716/118–125
See application file for complete search history.

(56) References Cited

U.S. PATENT DOCUMENTS

| 8,490,244 | B1* | 7/2013 | Joshi et al. | 716/124 |
| 8,578,316 | B1* | 11/2013 | Joshi et al. | 716/124 |
| 2011/0282478 | A1* | 11/2011 | Shen et al. | 700/104 |
| 2012/0273899 | A1* | 11/2012 | Wann et al. | 257/401 |
| 2012/0278781 | A1* | 11/2012 | Wann et al. | 716/122 |

* cited by examiner

*Primary Examiner* — Binh Tat
(74) *Attorney, Agent, or Firm* — Ditthavong & Steiner, P.C.

(57) ABSTRACT

An approach and apparatus are provided for optimizing and combining different semiconductor technologies into a single graphic data system. Embodiments include generating a planar semiconductor layout design, generating a three-dimensional (e.g., FinFET) semiconductor layout design, and combining the planar design and the FinFET design in a common graphic data system.

12 Claims, 4 Drawing Sheets

INTEGRATING OPTIMAL PLANAR AND THREE-DIMENSIONAL SEMICONDUCTOR DESIGN LAYOUTS

TECHNICAL FIELD

The present disclosure relates to semiconductor design layouts, and in particular, to accommodating the transition from planar to three-dimensional (e.g., FinFET) semiconductor design layouts. The present disclosure is particularly applicable to 20 nanometer (nm) technology nodes and beyond.

BACKGROUND

In designing semiconductor devices, design layouts for the devices can be optimized by optimizing certain features of the layout, such as the dimensions of the active region. However, optimization of the dimensions of the active region can be different based on whether the design layout is for a planar semiconductor design layout or a FinFET semiconductor design layout. For example, a planar transistor does not have a transistor width restriction. However, a FinFET width must be an integer multiple of a fin parameter (e.g., fin pitch), such as an integer multiple of 48 nm. Yet, a planar design can be migrated to a FinFET design to take advantage of FinFET performance improvements. Design transitioning efforts are, however, required to be minimal because of time to market and other constraints. Such constraints require minimal changes in the layout and schematics from planar to FinFET designs.

Making a transistor compatible in both semiconductor designs requires a transistor width quantization in the planar design to be compatible with the fin pitch (e.g., direct finification). Yet, direct finification leads to a reduction in the size of the active region for the planar design and, therefore, degrades performance of the planar transistor.

A need, therefore, exists for methodology and an apparatus enabling an optimal planar design without losing performance because of quantization while also maintaining an optimal FinFET design.

SUMMARY

An aspect of the present disclosure is a method for optimizing and combining planar and FinFET design layouts in a common graphic data system.

Another aspect of the present disclosure is an apparatus for optimizing and combining planar and FinFET design layouts in a common graphic data system.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: generating a planar semiconductor design layout, generating a three-dimensional (e.g., FinFET) semiconductor design layout, and combining the planar design and the FinFET design in a common graphic data system.

Aspects of the present disclosure include determining the planar design and the FinFET design based on common middle-of-line features. Other aspects include determining one or more dimensions of middle-of-line parameters for optimization of the planar design when generating the planar design, and deriving the FinFET design based on the optimized planar design. Another aspect includes determining the one or more dimensions includes optimizing an active area for the planar design. Additional aspects include determining one or more dimensions of middle-of-line features for optimization of the FinFET design when generating the FinFET design, and deriving the planar design based on the optimized FinFET design. Yet another aspect includes determining the one or more dimensions includes optimizing an active area for the FinFET design. Further aspects include determining a first set of one or more dimensions of middle-of-line features for optimization of the planar design when generating the planar design, and determining a second set of one or more dimensions of the middle-of-line features for optimization of the FinFET design when generating the FinFET design. Another aspect includes generating the planar design and the FinFET design based on common front-end-of-line (FEOL) and back-end-of-line (BEOL) layers. An additional aspect includes generating a design tape-out based the planar design or the FinFET design and disposing of the other of the planar design or the FinFET design.

Another aspect of the present disclosure is an apparatus including at least one processor, and at least one memory including computer program code for one or more programs, the at least one memory and the computer program code configured to, with the at least one processor, cause the apparatus to: generate a planar semiconductor design layout, generate a three-dimensional (e.g., FinFET) semiconductor design layout, and combine the planar design and the FinFET design in a common graphic data system.

Aspects of the present disclosure include the apparatus being further caused to determine the planar design and the FinFET design based on common middle-of-line features. Further aspects include the apparatus being further caused to determine one or more dimensions of middle-of-line features for optimization of the planar design when generating the planar design, and derive the FinFET design based on the optimized planar design. An additional aspect includes the apparatus being further caused to determine the one or more dimensions includes optimizing an active area for the planar design. Yet additional aspects include the apparatus being further caused to determine one or more dimensions of middle-of-line features for optimization of the FinFET design when generating the FinFET design, and derive the planar design based on the optimized FinFET design. Another aspect includes the apparatus being further caused to determine the one or more dimensions includes optimizing an active area for the FinFET design. Additional aspects include the apparatus being further caused to determine a first set of one or more dimensions of middle-of-line features for optimization of the planar design when generating the planar design, and determine a second set of one or more dimensions of the middle-of-line features for optimization of the FinFET design when generating the FinFET design. A further aspect includes the apparatus being further caused to generate the planar design and the FinFET design based on common FEOL and BEOL layers. Another aspect includes the apparatus being further caused to generate a design tape-out based the planar design or the FinFET design and disposing of the other of the planar design or the FinFET design.

Another aspect of the present disclosure is a computer-readable storage medium carrying one or more sequences of instructions which, when executed by one or more processors, cause an apparatus to: generate a planar semiconductor layout design, generate a three-dimensional (e.g., FinFET)

semiconductor layout design, and combine the planar design and the FinFET design in a common graphic data system.

According to the present disclosure, additional technical effects may be achieved in part by a method including: generating a planar semiconductor design layout based on FEOL and BEOL layers, generating a three-dimensional (e.g., FinFET) semiconductor design layout based on the FEOL and BEOL layers, and combining the planar design and the FinFET design in a common graphic data system. Another aspect includes generating a design tape-out based the planar design or the FinFET design and disposing of the other of the planar design or the FinFET design.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

Figure 1:
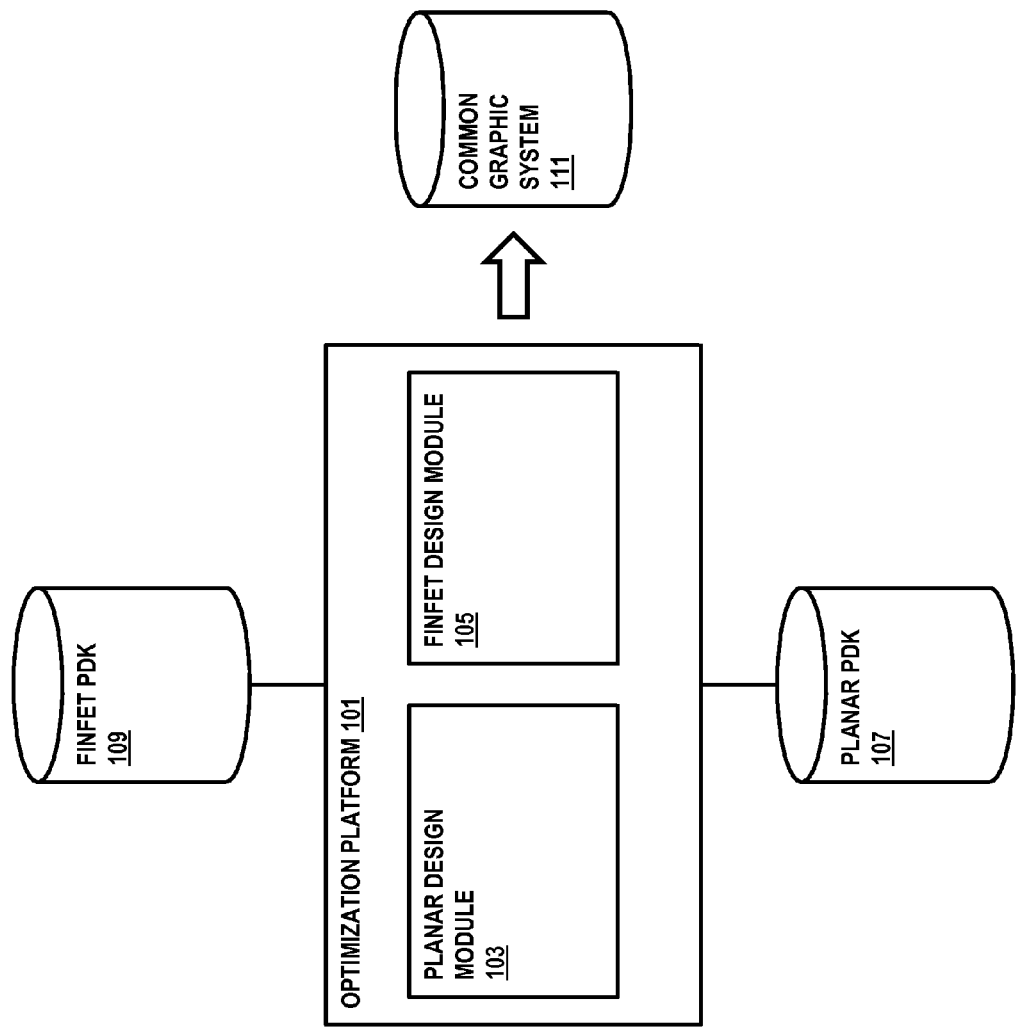
FIG. 1 schematically illustrates an overall system capable of optimizing and combining planar and FinFET design layouts in a common graphic data system, according to an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

Direct finification of a planar design into a FinFET design causes a reduction in the size of the active region for the planar design. Such a reduction in the active region can be from 1 to (fin pitch −1) nm. The reduction in the size of the active region causes a loss of performance of a device resulting from the planar design. Accordingly, planar design performance resulting from direct finification is traded to achieve direct compatibility with a FinFET design. Thus, a more flexible technique than direct finification is needed that also maintains performance.

The present disclosure addresses and solves the problem of reduced planar design active regions resulting in degraded planar transistor performance attendant upon designing compatible planar and FinFET (e.g., three-dimensional) semiconductor design layouts for transitioning to layouts relying primarily on FinFET designs. In accordance with embodiments of the present disclosure, a common graphic data system is created. The common graphic data system can include a semiconductor design with an active region and middle-of-line (MOL) features that are optimized for planar designs, FinFET designs, or both. Where the common graphic data system includes a semiconductor design with an active region and MOL features optimized for only a planar design, the graphic data system can include a FinFET design that is based on the active region and MOL features optimized for the planar design. Where the common graphic data system includes a semiconductor design with an active region and MOL features optimized for only a FinFET design, the graphic data system can include a planar design that is based on the active region and MOL features optimized for the FinFET design.

The planar design and then FinFET design within the common graphic data system constitutes different sets of layers. Depending on the desired layout for a particular semiconductor design or feature, the desired set of layers (i.e., planar set or FinFET set) may be selected and the other set of layers may be discarded.

Methodology in accordance with embodiments of the present disclosure includes generating both a planar semiconductor layout design and a FinFET semiconductor layout design. The planar design and the FinFET design are generated based on a common active region and common MOL features or a different active region and different MOL features. Next, the generated planar and FinFET designs are combined into a common graphic data system. The foregoing methodology allows for a gradual transition between current planar designs and FinFET designs within the same graphic data system.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIG. 1 schematically illustrates an overall system diagram for generating both a planar semiconductor design layout and a FinFET semiconductor design layout in a common graphic data system. The optimization platform 101 can perform the combining of the planar design and the FinFET design into a common graphic data system. The optimization platform 101 may include planar design module 103 and a FinFET design module 105 for use in optimizing the different design technologies for a particular layout. Information from a planar process design kit (PDK) 107 and a FinFET PDK 109 can be used to verify the determined planar and FinFET designs prior to, or subsequent to, the design layouts being added to the common graphic data system 111.

In the current approach, a combined layout is drawn using two different technologies, such as planar and FinFET designs. According to one approach, the planar design can retain the optimized transistor width based on an active region for the planar design, and a FinFET design is obtained with an optimized gridded active region. Thus, a single graphic data system includes a set of layers for two different technologies, such as a set of layers for the planar design and a set of layers for the FinFET design. When creating a semiconductor device based on the planar design, the set of layers for the FinFET design is discarded. When creating a semiconductor device based on the FinFET design, the set of layers for the planar design is discarded.

There are three approaches for combining the two technologies into a single or common graphic data system. Under the three approaches discussed below, the processes and features associated with the BEOL are the same. Thus, the metal 1 layer (e.g., M1), metal 2 layer (e.g., M2) and additional vertical interconnect (VIA) layers (e.g., V1, V2, etc.) are the same for all three approaches. The three approaches also enable optimized designs with respect to independent p-type metal oxide semiconductor (PMOS) and n-type metal oxide semiconductor (NMOS) tuning for the planar design and the FinFET design.

Under a first approach, the planar design is optimized for the planar transistor width, including optimizing the dimensions of the active region. From the optimized planar design, a FinFET design is determined that uses the active region of the planar design. Thus, the active region is gridded for the FinFET design according to the designed fin pitch (e.g., 48 nm). Common MOL features are then determined for both the planar design and the FinFET design that are constrained to match the gridded active region for the FinFET design.

Under a second approach, the active region and the MOL features, including the trench silicide (TS), contact to the active region (CA), contact to the gate (CB) and the first VIA layer (V0), are optimized for the FinFET design. Using the constraints of the MOL features optimized for the FinFET design, a best possible active region is obtained for the planar design.

Under a third approach, the active region is optimized for the planar design with a transistor width and with a set of MOL features for the planar design. Then, a separate active region is optimized for the FinFET design with separate MOL features also optimized for the FinFET.

For each one of the above three approaches there are two sets of layers that are created that represent the layouts of the active region and the MOL features and are included within the common graphic data system. The first set corresponding to the planar design includes layers for the active region (e.g., RX), the TS, two sets of contacts, CA and CB, and the V0 layer. The second set corresponding to the FinFET design includes layers for the active region (e.g., RX_Q), the trench silicide (e.g., TS_Q), two sets of contacts (e.g., CA_Q and CB_Q), and a vertical interconnect (VIA) layer (e.g., V0_Q). The FinFET design may also include a layer that indicates the number of fins (e.g., RX_FIN) and a FinFET mandrel layer (e.g., FN) used to generate the fins. Thus, the resulting common graphic data system will have alternative sets of disposable layers RX/RX_Q, TS/TS_Q, CA/CA_Q, CB/CB_Q, and V0/V0_Q, in addition to the layers RX_FIN and FN for the FinFET set of layers.

When a planar design is desired based on the common graphic data system, the layers RX, TS, CA, CB, and V0 are used. The set of layers for the FinFET design are discarded. When a FinFET design is desired based on the common graphic data system, the layers RX_Q, TS_Q, CA_Q, CB_Q, and V0_Q are used, in addition to the layers RX_FIN and FN. The set of layers for the planar design are discarded. The foregoing layers for the FinFET design may be mapped to standard layer naming (e.g., RX, TS, CA, CB, and V0) for subsequent processing.

According to the above disclosure, the common graphic data system allows for a combined layout development technique that allows for different native PDK usage for design verification (e.g., layout versus schematic (LVS), design rule check (DRC), etc.), analysis and sign-off tapeout. For the planar design, the common graphic data system can be used with a planar PDK. For the FinFET design, after mapping the layers, the layers can be used with a FinFET PDK.

Figure 2:
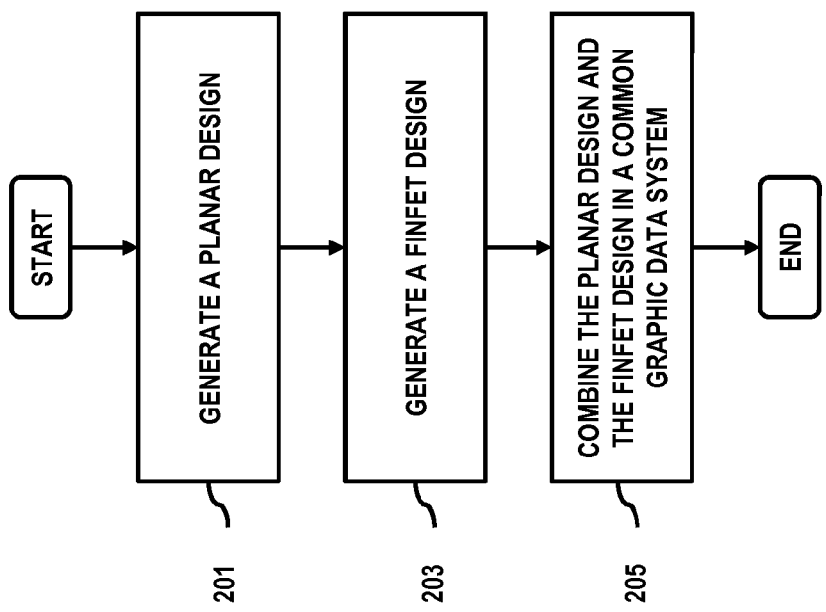
FIG. 2 is a flowchart of a process for combining a planar design and a FinFET design in a common graphic data system, according to an exemplary embodiment.
Figure 4:
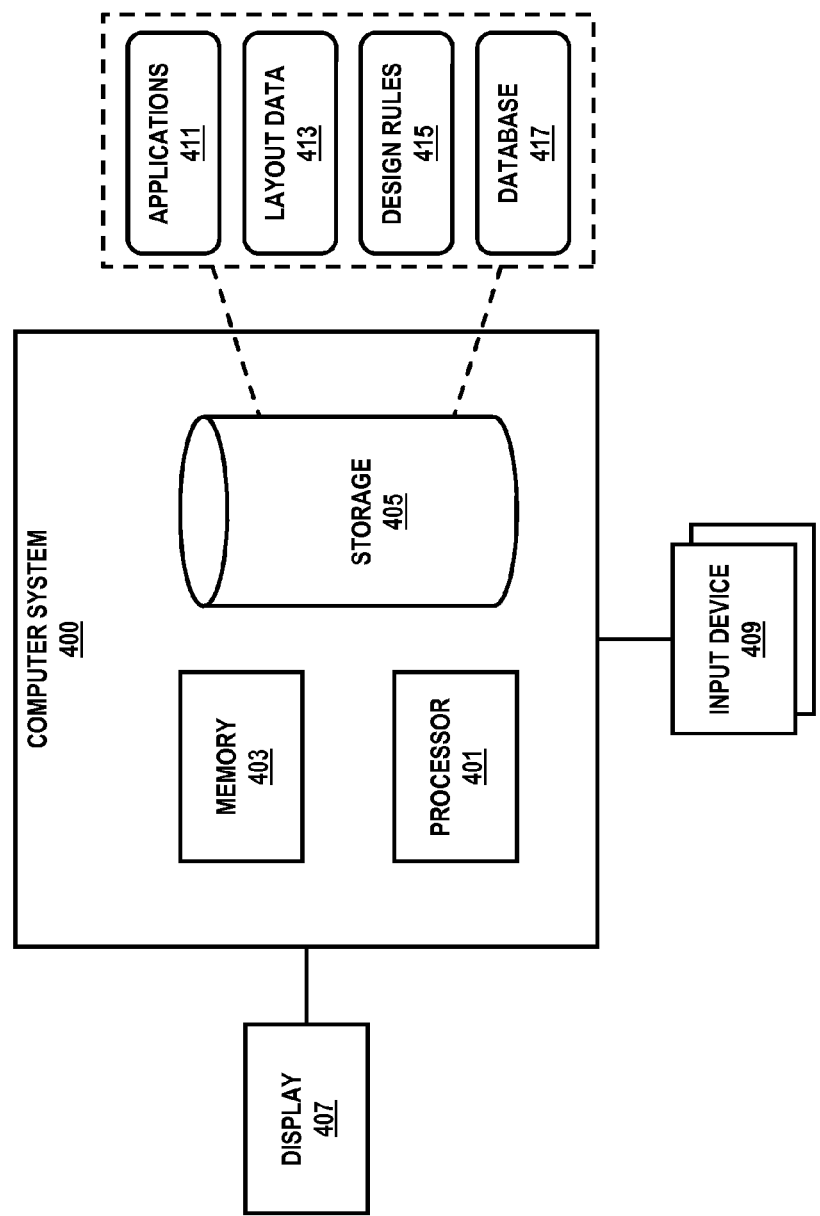
FIG. 4 schematically illustrates a computer system for implementing the processes of FIGS. 2 and 3, according to an exemplary embodiment.

FIG. 2 is a flowchart of a process for combining a planar design and a FinFET design in a common graphic data system, according to an exemplary embodiment. The optimization platform 101 may perform the process and may be implemented in, for instance, a chip set including a processor and a memory as shown in FIG. 4. Although the steps are shown in a particular order, in alternative embodiments, one or more of the steps may occur in a different order (e.g., step 201 may occur after step 203).

In step 201, a planar design is generated. The planar design may be generated based on one of the three approaches discussed above. Accordingly, under a first approach, the planar design is optimized for the planar transistor width, including optimizing the dimensions of the active region. As such, the active region may have a dimension of 207 nm. Under a second approach, as discussed further with respect to generating the FinFET design (step 203) discussed below, using constraints of the MOL features optimized for the FinFET design, a best possible active region is obtained for the planar design. Further, under a third approach, the active region is optimized for the planar design with a transistor width and with a set of MOL features for the planar design.

In step 203, a FinFET design is generated. The FinFET design may be generated based on one of the three approaches discussed above. Accordingly, under a first approach, based on the optimized planar design generated in step 201, a FinFET design is determined that uses the active region of the planar design. Thus, the active region is gridded for the FinFET design according to the designed fin pitch (e.g., 48 nm). Under the first approach, after steps 201 and 203, common MOL features are determined for both the planar design and the FinFET design that are constrained to match the gridded active region for the FinFET design. Under a second approach, as discussed above, a FinFET design is generated with the active region and the MOL features optimized for the FinFET design (e.g., 192 nm). The planar design may then be generated based on these features in step 201. Under the third approach, a separate active region is optimized for the FinFET design with separate MOL features also optimized for the FinFET. Then, in step 205, the generated planar design and FinFET design are combined into a single graphic data system.

Figure 3:
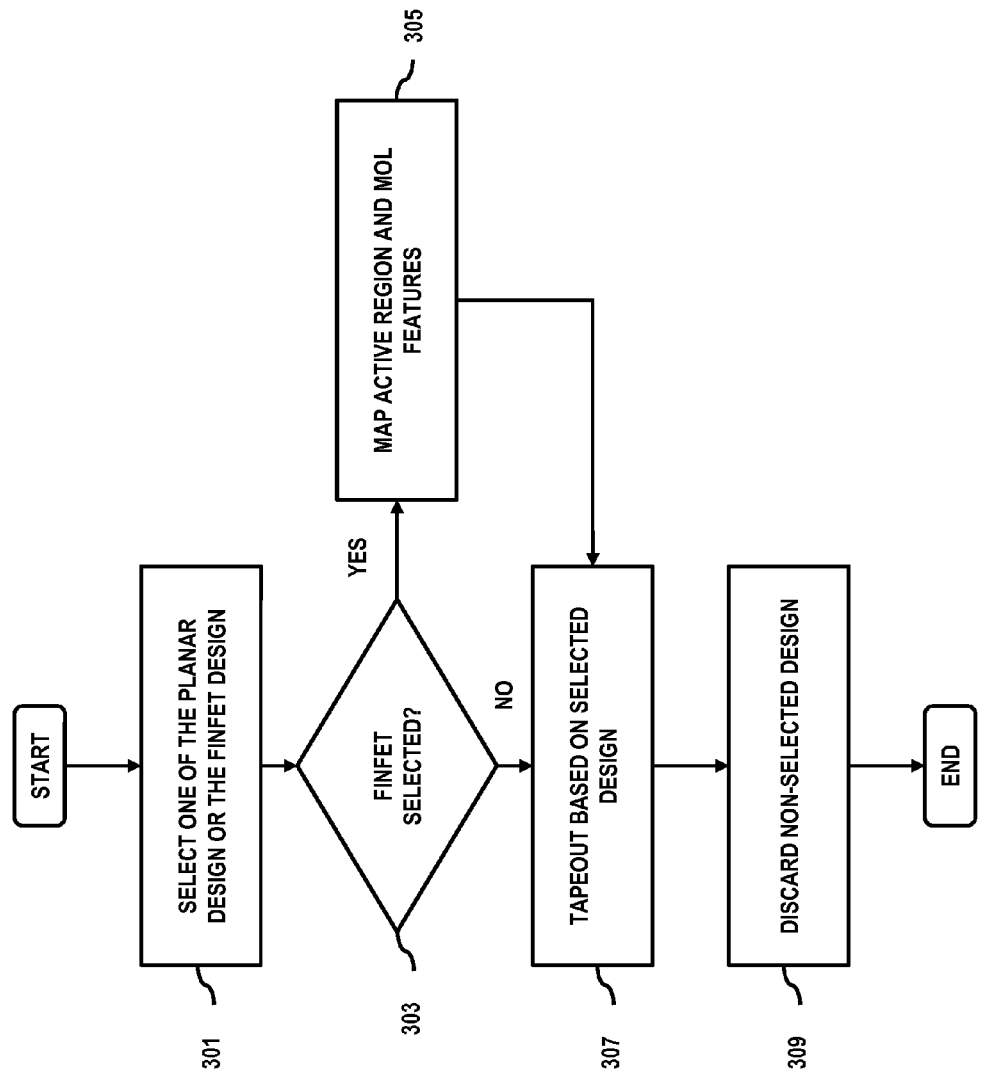
FIG. 3 is a flowchart of a process for selecting one of a planar design or a FinFET design from a common graphic data system for generating a semiconductor device, according to an exemplary embodiment.

FIG. 3 is a flowchart of a process for selecting one of a planar design or a FinFET design from a common graphic data system for generating a semiconductor device, according to an exemplary embodiment. The optimization platform 101 may perform the process and may be implemented in, for instance, a chip set including a processor and a memory as shown in FIG. 4. Although the steps are shown in a particular order, in alternative embodiments, one or more of the steps may occur in a different order (e.g., step 309 may occur immediately after step 301).

In step 301, one of the planar design and the FinFET design is selected from the common graphic data system. The selection is based on which technology is desired for a particular semiconductor device. In step 303, it is determined whether the FinFET design was selected. If the FinFET design was selected, the process proceeds to step 305. If the FinFET design was not selected (i.e., planar design was selected), the process proceeds to step 307.

When the FinFET design is selected, the layers RX_Q, TS_Q, CA_Q, CB_Q, and V0_Q within the graphic data system are used, in addition to the layers RX_FIN and FN. At step 305, the above layers for the FinFET design are mapped to rename the layers to RX, TS, CA, CB, and V0, respectively, while keeping the RX_FIN and FN layers. If the planar design is selected, the layers RX, TS, CA, CB, and V0 are already present and may be used.

At step 307, the selected design undergoes verification associated with the native PDK for the selected layers, analysis and sign-off tapeout. As discussed above, for the planar design, the common graphic data system can be used with a planar PDK. For the FinFET design, after renaming the layers, the layers can be used with a FinFET PDK. Finally, at step 309, the design according to the technology that was not selected is discarded.

The processes described herein may be implemented via software, hardware, firmware, or a combination thereof. Exemplary hardware (e.g., computing hardware) is schematically illustrated in FIG. 4. As shown, computer system 400 includes at least one processor 401, at least one memory 403, and at least one storage 405. Computer system 400 optionally may be coupled to display 407 and one or more input devices 409, such as a keyboard and a pointing device. Display 407 may be utilized to provide one or more GUI interfaces. Input devices 409 may be utilized by users of computer system 400 to interact with, for instance, the GUI interfaces. Storage 405 may store applications 411, layout data (or information) 413, design plus rules 415, and at least one shape database (or repository) 417. Applications 411 may include instructions (or computer program code) that when executed by processor 401 cause computer system 400 to perform one or more processes, such as one or more of the processes described herein.

The embodiments of the present disclosure can achieve several technical effects, including allowing for a gradual transition from planar to FinFET semiconductor design layouts without impinging on the performance of either design layout. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   determining one or more dimensions of middle-of-line features for optimization of a planar semiconductor layout design, including optimizing an active area of the planar semiconductor layout design;
   generating an optimized planar semiconductor layout design based on the one or more dimensions of middle-of-line features;
   generating a FinFET semiconductor layout design based on the optimized planar semiconductor layout design; and
   combining the optimized planar semiconductor layout design and the FinFET semiconductor layout design, by a processor, in a common graphic data system,
   wherein the optimized planar semiconductor layout design and the FinFET semiconductor layout design are determined based on common middle-of-line features.

2. The method according to claim 1, comprising:
   generating the optimized planar semiconductor layout design and the FinFET semiconductor layout design based on common front-end-of-line (FEOL) and back-end-of-line (BEOL) layers.

3. The method according to claim 1, further comprising:
   generating a design tape-out based on the optimized planar semiconductor layout design or the FinFET semiconductor layout design and disposing of the other of the optimized planar semiconductor layout design or the FinFET semiconductor layout design.

4. An apparatus comprising:
   at least one processor; and
   at least one memory including computer program code for one or more programs, the at least one memory and the computer program code configured to, with the at least one processor, cause the apparatus to perform at least the following,
   determine one or more dimensions of middle-of-line features for optimization of a planar semiconductor layout design, including optimizing an active area of the planar semiconductor layout design;
   generate an optimized planar semiconductor layout design based on the one or more dimensions of middle-of-line features;
   generate a FinFET semiconductor layout design based on the optimized planar semiconductor layout design; and
   combine the optimized planar semiconductor layout design and the FinFET semiconductor layout design in a common graphic data system,
   wherein the optimized planar semiconductor layout design and the FinFET semiconductor layout design are determined based on common middle-of-line features.

5. The apparatus according to claim 4, wherein the apparatus is further caused to:
   generate the optimized planar semiconductor layout design and the FinFET semiconductor layout design based on common front-end-of-line (FEOL) and back-end-of-line (BEOL) layers.

6. The apparatus according to claim 4, wherein the apparatus is further caused to:
   generate a design tape-out based on the optimized planar semiconductor layout design or the FinFET semiconductor layout design and dispose of the other of the optimized planar semiconductor layout design or the FinFET semiconductor layout design.

7. A method comprising:
   determining one or more dimensions of middle-of-line features for optimization of a FinFET semiconductor layout design, including optimizing an active area of the FinFET semiconductor layout design;

generating an optimized FinFET semiconductor layout design based on the one or more dimensions of middle-of-line features;
generating a planar semiconductor layout design based on the optimized FinFET semiconductor layout design; and
combining the optimized FinFET semiconductor layout design and the planar semiconductor layout design, by a processor, in a common graphic data system,
wherein the planar semiconductor layout design and the optimized FinFET semiconductor layout design are determined based on common middle-of-line features.

8. The method according to claim 7, comprising:
generating the planar semiconductor layout design and the optimized FinFET semiconductor layout design based on common front-end-of-line (FEOL) and back-end-of-line (BEOL) layers.

9. The method according to claim 7, further comprising:
generating a design tape-out based on the planar semiconductor layout design or the optimized FinFET semiconductor layout design and disposing of the other of the planar semiconductor layout design or the optimized FinFET semiconductor layout design.

10. An apparatus comprising:
at least one processor; and
at least one memory including computer program code for one or more programs, the at least one memory and the computer program code configured to, with the at least one processor, cause the apparatus to perform at least the following,
determine one or more dimensions of middle-of-line features for optimization of a FinFET semiconductor layout design, including optimizing an active area of the FinFET semiconductor layout design;
generate an optimized FinFET semiconductor layout design based on the one or more dimensions of middle-of-line features;
generate a planar semiconductor layout design based on the optimized FinFET semiconductor layout design; and
combine the optimized FinFET semiconductor layout design and the planar semiconductor layout design, by a processor, in a common graphic data system,
wherein the planar semiconductor layout design and the optimized FinFET semiconductor layout design are determined based on common middle-of-line features.

11. The apparatus according to claim 10, wherein the apparatus is further caused to:
generate the planar semiconductor layout design and the optimized FinFET semiconductor layout design based on common front-end-of-line (FEOL) and back-end-of-line (BEOL) layers.

12. The apparatus according to claim 10, wherein the apparatus is further caused to:
generate a design tape-out based on the planar semiconductor layout design or the optimized FinFET semiconductor layout design and dispose of the other of the planar semiconductor layout design or the optimized FinFET semiconductor layout design.

* * * * *